(12) United States Patent
Okitaka

(10) Patent No.: US 6,297,662 B1
(45) Date of Patent: Oct. 2, 2001

(54) SEMICONDUCTOR DEVICE

(75) Inventor: Takenori Okitaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/450,760

(22) Filed: Nov. 30, 1999

(30) Foreign Application Priority Data

Jul. 2, 1999 (JP) .................................. 11-188916

(51) Int. Cl.[7] .................................. H03K 19/00
(52) U.S. Cl. .................................. 326/16; 326/40; 714/724
(58) Field of Search .................................. 326/16, 40, 46; 714/724, 725

(56) References Cited

U.S. PATENT DOCUMENTS 5,072,448 * 12/1991 Atwell et al. .................. 371/20.4
5,361,264 * 11/1994 Lewis .......................... 371/22.5
5,446,768 * 8/1995 Griffin et al. .................. 375/377
5,717,701 * 2/1998 Angelotti et al. .............. 371/22.3

FOREIGN PATENT DOCUMENTS

| 2-170070 A | 6/1990 | (JP) . |
| 7-98358 A | 4/1995 | (JP) . |
| 10-339762 A | 12/1998 | (JP) . |
| 2000227458-A | * 8/2000 | (JP) . |

* cited by examiner

Primary Examiner—Michael Tokar
Assistant Examiner—Daniel D. Chang
(74) Attorney, Agent, or Firm—Leydig, Voit & Mayer, Ltd.

(57) ABSTRACT

A semiconductor device in which outputs of flip-flops are not stopped even if one of the logic blocks of a test circuit is not activated. A burn-in test circuit has an XOR circuit by which, when an output signal and a burn-in input signal of one logic block is supplied, the other logic blocks are activated.

4 Claims, 8 Drawing Sheets

SEMICONDUCTOR DEVICE

FIELD OF THE INVENTION

The present invention relates to a semiconductor device which is capable of efficiently conducting a burn-in test.

BACKGROUND OF THE INVENTION

FIG. 8 is a diagram showing a structure of a conventional semiconductor device for conducting a burn-in test. This semiconductor device is disclosed, for example, in Japanese Patent Application Laid-Open (JP-A) No. HEI 7-98358. With reference to FIG. 8, the conventional semiconductor device is constituted so as to have a circuit for generating test data at the time of the burn-in test in which a feedback loop is provided in a serial test circuit composed of four flip-flops (hereinafter, shown as F/F) 1000 through 4000. The F/Fs 1000 through 4000 are connected with each other in series by mutually connecting the serial input terminals SI and serial output terminals SO.

In addition, in the F/Fs 1000 through 4000, the data which is supplied to the serial input terminals SI in a serial mode where input CP is "1", input A is "0" and input B is "1" is directly outputted into serial output terminals SO and output terminals Q. When an input TEST is "0", an output from the serial output terminal SO of the F/F 4000 on the final stage is inverted via the feedback loop so as to be given to the serial input of the F/F 1000 at the first stage. That is, when the input TEST is "0" in the serial mode, "0" and "1" are outputted alternately in a closed loop of the four F/Fs 1000 through 4000.

The values of "0" and "1" as activation signals of the burn-in test are supplied to the logic blocks 5000 through 7000, which are connected respectively with the F/Fs 1000 through 4000 so as to become a circuit to be tested. As a result, the logic blocks 5000 through 7000 are activated.

Accordingly, the logic blocks are activated without supplying a clock signal from the outside and the burn-in test can be conducted.

The burn-in test is conducted by the conventional semiconductor device on condition that the logic blocks 5000 through 7000 are activated. If any one of the logic blocks is not activated then there is possibility that the output Q of the F/Fs is stopped.

Moreover, it is difficult to specify which logic block is defective.

Further, in order to obtain a semiconductor device which is capable of efficiently conducting a burn-in test, it is necessary to give a voltage stress to all nodes of the logic blocks via burn-in test terminals which should be as few as possible, considering the a restriction (the number of drivers or the pattern length of the burn-in apparatus) of a burn-in apparatus.

However, compared with the number of input terminals in the semiconductor device there is a limitation to the number of the drivers in the burn-in apparatus. Therefore, desired data cannot be inputted into the logic blocks of the semiconductor device by freely combining them, and thus it is difficult to invert all the nodes.

SUMMARY OF THE INVENTION

In light of the problems described above, it is an object of the present invention to provide a semiconductor device which is capable of efficiently conducting a burn-in test.

In the semiconductor device of the present invention, a burn-in test circuit has an XOR circuit to which, when an output signal and a burn-in input signal of one logic block is supplied, then the other logic blocks are activated. Therefore, even if it is difficult to activate one logic block, the burn-in test can be continued without stopping the outputs of the F/F thereafter.

Other objects and features of this invention will become apparent from the following description with reference to the accompanying drawings.

DESCRIPTION OF THE PREFERRED EMBODIMENTS

Figure 1:
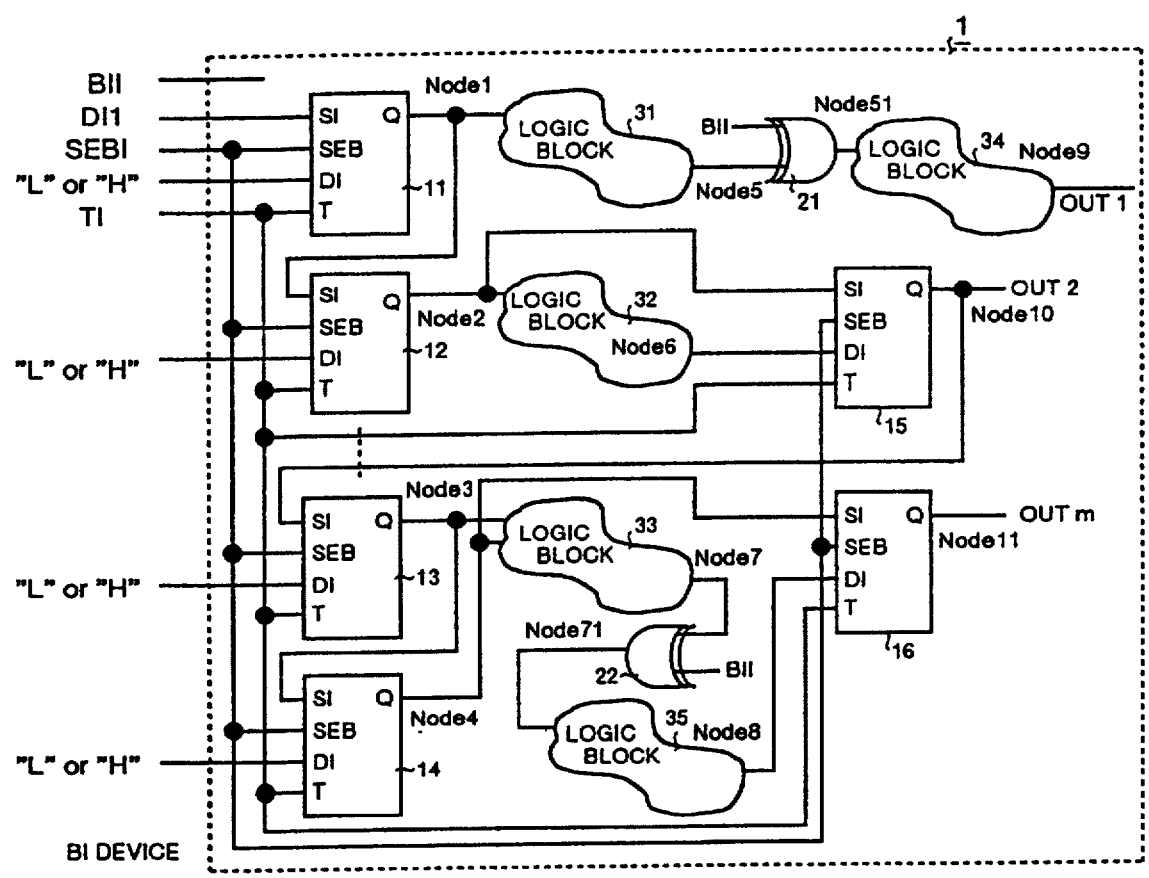
FIG. 1 is a block diagram of a semiconductor device according to a first embodiment of the invention.

Preferred embodiments of the invention will be explained with reference to the accompanying drawings. FIG. 1 is a block diagram of a semiconductor device according to a first embodiment. As shown in FIG. 1, a burn-in input signal BII, a driver output signal DI1, a clock input signal TI, a selector burn-in signal SEBI and "L" or "H" data are inputted from a burn-in apparatus into a semiconductor device 1.

In addition, the semiconductor device 1 is composed of F/Fs 11 through 16, logic blocks 31 through 35 which are connected respectively with output terminals Q of the F/Fs 11 through 16, and XOR circuits 21 and 22 which are connected with one of the logic blocks 31 through 35. The F/Fs 11 through 16 are provided respectively with serial input terminals SI, selector burn-in terminals SEB, clock terminals T, data input terminals DI and the output terminals Q. The driver output signal DI1 of the burn-in apparatus is inputted into the serial input terminal SI. The selector burn-in signal SEBI is inputted into the selector burn-in terminal SEB. The clock input signal TI is inputted into the clock terminal T. The "L" or "H" data are inputted into the data input terminal DI.

Moreover, the output terminal Q of the F/F 11 is connected with the logic block 31, and is provided with a node 1. The node 1 is connected with the serial input terminal SI of the F/F 12. Moreover, an output terminal of the logic block 31 is connected with the XOR circuit 21, and is provided with a node 5. Further, an output terminal of the XOR circuit 21 is connected with the logic block 34, and is provided with a node 51. Further, an output terminal of the logic block 34 is provided with a node 9.

Further, the output terminal Q of the F/F 12 is connected with the logic block 32, and is provided with a node 2. The node 2 is connected with the serial input terminal SI of the F/F 15. Moreover, an output terminal of the logic block 32 is connected with the data input terminal DI of the F/F 15, and is provided with a node 6. Further, the output terminal Q of the F/F 15 is connected with the serial input terminal SI of the F/F 13, and is provided with a node 10.

Moreover, the output terminal Q of the F/F 13 is connected with the logic block 33, and is provided with a node 3. The node 3 is connected with the serial input terminal SI of the F/F 14. Moreover, an output terminal of the logic block 33 is connected with the XOR circuit 22, and is provided with a node 7. Further, an output terminal of the XOR circuit 22 is connected with the logic block 35, and is provided with a node 71. An output terminal of the logic block 35 is connected with the data input terminal DI of the F/F 16, and is provided with a node 8. Moreover, the output terminal Q of the F/F 16 is provided with a node 11.

Furthermore, the output terminal Q of the F/F 14 is connected with the logic block 33, and is provided with a node 4. The node 4 is connected with the serial input terminal SI of the F/F 16.

Figure 2:
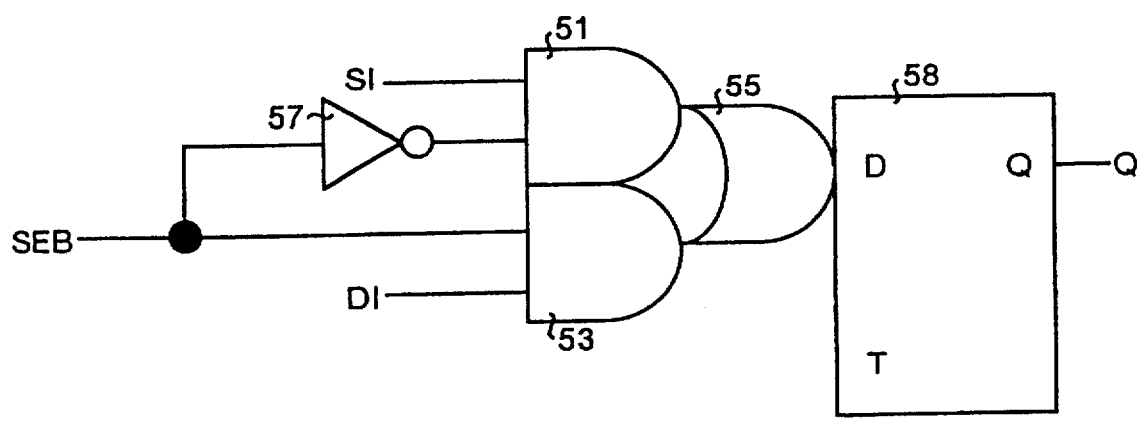
FIG. 2 is a circuit diagram of an F/F to be used in the semiconductor device according to the first embodiment of the invention.

Next, FIG. 2 is a circuit diagram of the F/F which is used semiconductor device according to the first embodiment. As shown in FIG. 2, the F/F is composed of an AND circuit 53, an inverter circuit 57, an AND circuit 51, an OR circuit 55 and a flip-flop 58. The AND circuit 53 has a data input terminal DI and a selector burn-in terminal SEB into which a selector burn-in signal SEBI is inputted. The inverter circuit 57 is connected with the selector burn-in terminal SEB into which a selector burn-in signal SEBI is inputted. The AND circuit 51 has a serial input terminal SI and a terminal into which a signal inverted by the inverter circuit 57 is inputted. The OR circuit 55 is connected with output terminals of the AND circuits 51 and 53. The flip-flop 58 has a clock terminal T into which a clock input signal TI is inputted by connecting an output terminal of the OR circuit 55 with the data input terminal DI.

As for an operation of the F/F, in the case where signals of "1", "0", "1", "0" are supplied to the data input terminal DI and signals of "1", "1", "0", "0" are supplied to the selector burn-in terminal SEB into which the selector burn-in signal SEBI is inputted, outputs of the AND circuit 53 are "1", "0", "0", "0". Moreover, in the case where signals of "1", "0", "1", "0" are supplied into the serial input terminal SI and a signal inverted by the inverter circuit 57 is supplied to the selector burn-in terminal SEB into which a selector burn-in signal SEBI is inputted, outputs of the AND circuit 51 are "0", "0", "1", "0".

Output of the OR circuit 55 become "1", "0", "1", "0" according to the output signals of the AND circuits 51 and 53, and is inputted into the data input terminal D of the flip-flop 58. Moreover, when a clock input signal TI is inputted into the clock terminal T of the flip-flop 58, a signal to be applied directly to the data input terminal D is outputted from the output terminal Q.

Figure 3:
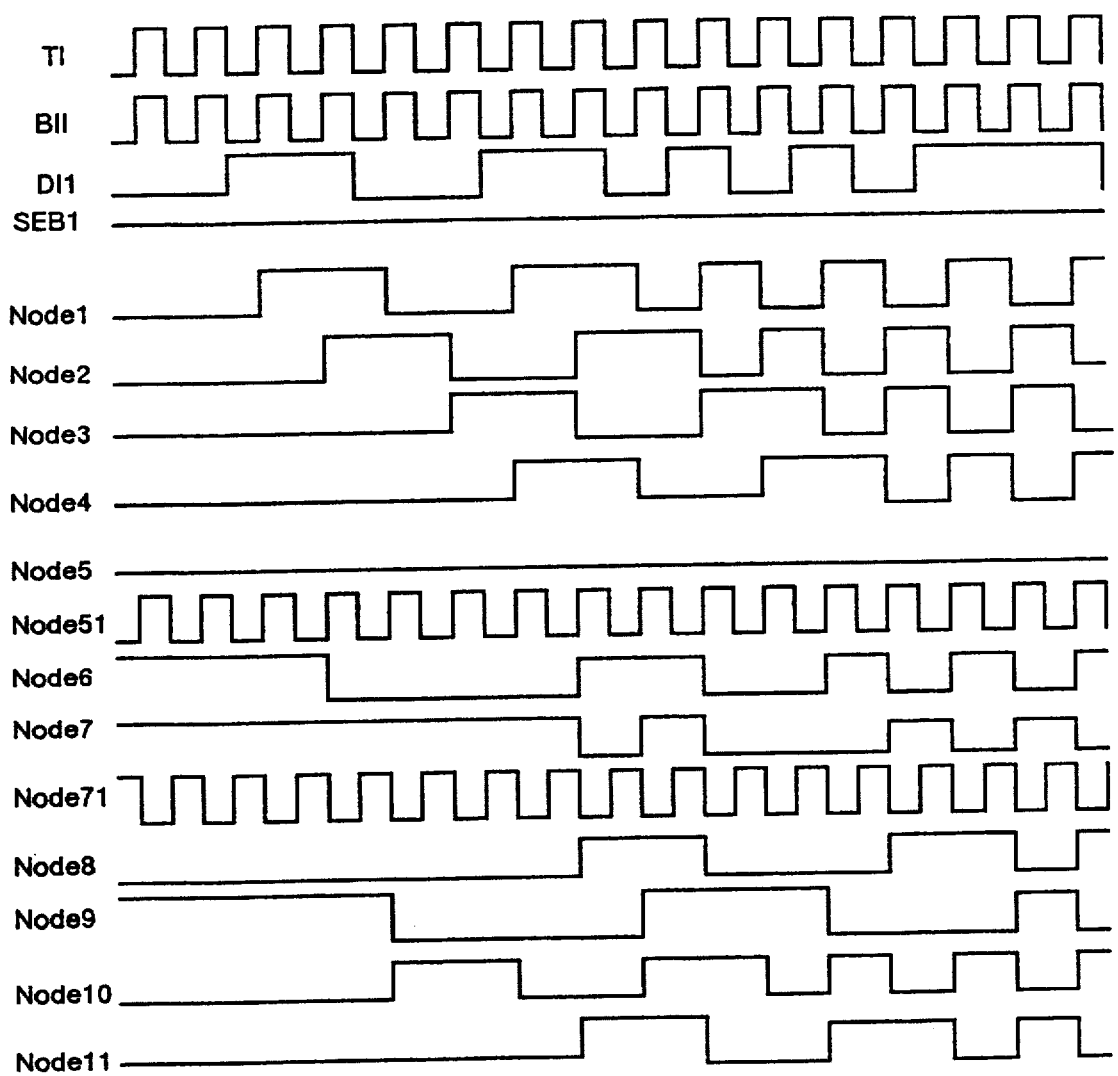
FIG. 3 is a timing chart of the semiconductor device according to the first embodiment of the invention.

Further, FIG. 3 is a timing chart of the semiconductor device according to the first embodiment. As shown in FIG. 3, a clock input signal TI, a driver output signal DI1 and a selector burn-in signal SEBI are inputted from the burn-in apparatus into terminals corresponding to the F/Fs 11 through 16 of the semiconductor device 1. Moreover, a burn-in input signal BII is inputted into the XOR circuits 21 and 22 of the semiconductor device 1.

For example, in the case where a defect occurs in the logic block 31 and the node 5 is maintained in "L", since the node 51 is connected with the XOR circuit 21, due to the burn-in input signal BII, a signal waveform similar to the burn-in input signal BII is generated at the node 51. The logic block 34 generates an inverted signal waveform like a signal of the node 9 by the signal of the node 51.

Further, when the signal waveforms of the node 2 and the node 6 are compared with each other, an operating state of the logic block 32 is found. When the signal waveforms of the node 2 and the node 10 are compared with each other, a delay state is found.

Further, when the signal waveforms of the node 4 and the node 7 are compared with each other, an operating state of the logic block 33 is found. When the signal waveforms of the node 4, the node 8 and the node 11 are compared with each other, a delay state is found. Even if a defect occurs in one of the logic blocks connected with the XOR circuits, a logic block to be connected next can be activated by the XOR circuits, and thus the burn-in test can be continued without stopping the output Q of the F/F.

According to the first embodiment, even in the case where it is difficult to activate one logic block, the burn-in test can be continued without stopping the outputs Q of the F/F thereafter.

Further, according to the first embodiment, it is easy to specify a logic block where a defect occurs.

Furthermore, according to the first embodiment, since a voltage stress can be given to all the nodes in the logic blocks, the burn-in test can be conducted efficiently.

Figure 4:
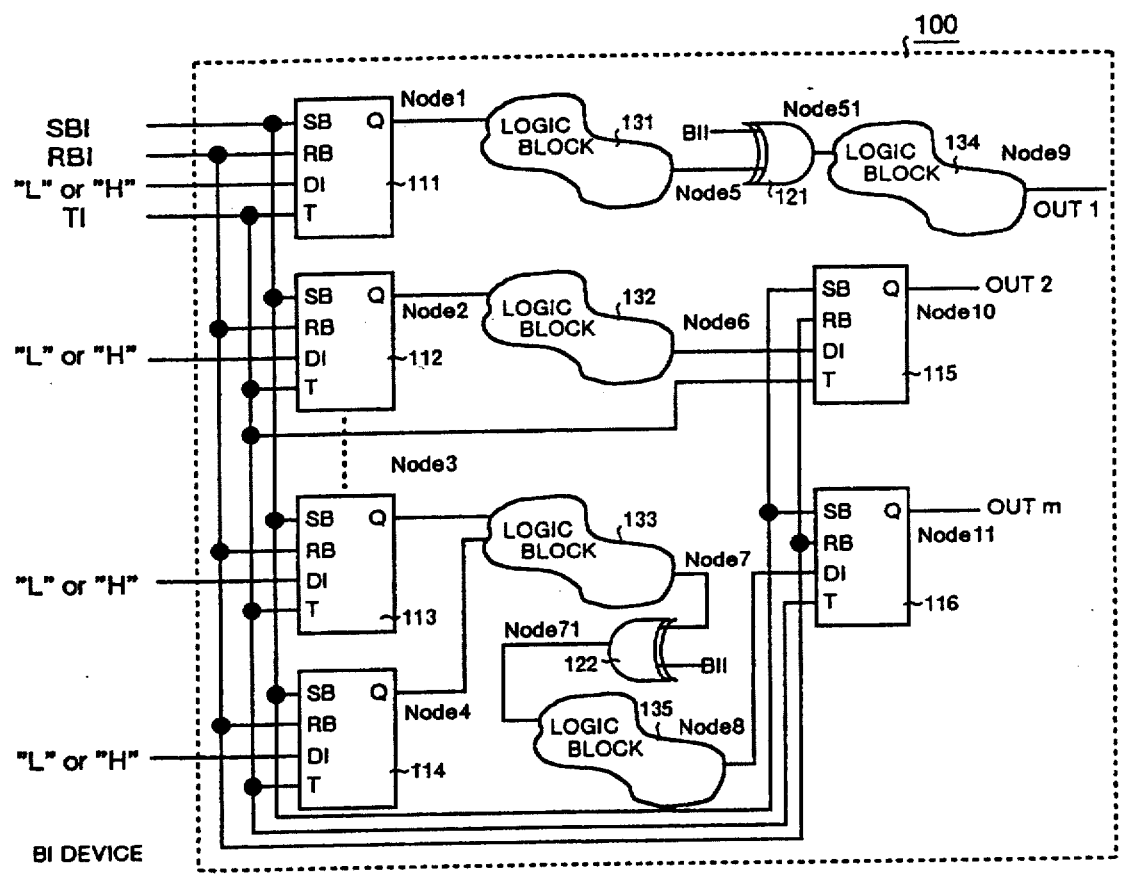
FIG. 4 is a block diagram of the semiconductor device according to a second embodiment of the invention.

FIG. 4 is a block diagram of the semiconductor device according to a second embodiment. As shown in FIG. 4, a set burn-in signal SBI, a reset burn-in signal RBI, a clock input signal TI, "L" or "H" data and a burn-in input signal BII are inputted from the burn-in apparatus into a semiconductor device 100.

Further, the semiconductor device 100 is composed of F/Fs 111 through 116, logic blocks 131 through 135 and XOR circuits 121 and 122. The F/Fs 111 through 116 are provided respectively with set burn-in terminals SB, reset burn-in terminals RB, clock terminals T, data input terminals DI and output terminals Q. A set burn-in signal SBI of the burn-in apparatus is inputted into the set burn-in terminals SB. A reset burn-in signal RBI is inputted into the reset burn-in terminals RB. A clock input signal TI is inputted into the clock terminals T. "L" or "H" data are inputted into the data input terminals DI. The logic blocks 131 through 135 are connected with output terminals Q of the F/Fs 111 through 116. The XOR circuits 121 and 122 are connected with one of the logic blocks 131 through 135.

Further, the output terminal Q of the F/F 111 is connected with the logic block 131 and is provided with a node 1. Moreover, an output terminal of the logic block 131 is connected with the XOR circuit 121 and is provided with a node 5. Further, an output terminal of the XOR circuit 121 is connected with the logic block 134 and is provided with a node 51. Further, an output terminal of the logic block 134 is provided with a node 9.

Further, the output terminal Q of the F/F 112 is connected with the logic block 132 and is provided with a node 2. Moreover, an output terminal of the logic block 132 is connected with the data input terminal DI of the F/F 115 and is provided with a node 6. Further, the output terminal Q of the F/F 115 is provided with a node 10.

Further, the output terminal Q of the F/F 113 is connected with the logic block 133 and is provided with a node 3. Moreover, an output terminal of the logic block 133 is connected with the XOR circuit 122 and is provided with a node 7. Further, an output terminal of the XOR circuit 122 is connected with the logic block 135 and is provided with a node 71. An output terminal of the logic block 135 is connected with the data input terminal DI of the F/F 116 and is provided with a node 8. Moreover, the output terminal Q of the F/F 16 is provided with a node 11.

Furthermore, the output terminal Q of the F/F 114 is connected with the logic block 133 and is provided with a node 4.

Figure 5:
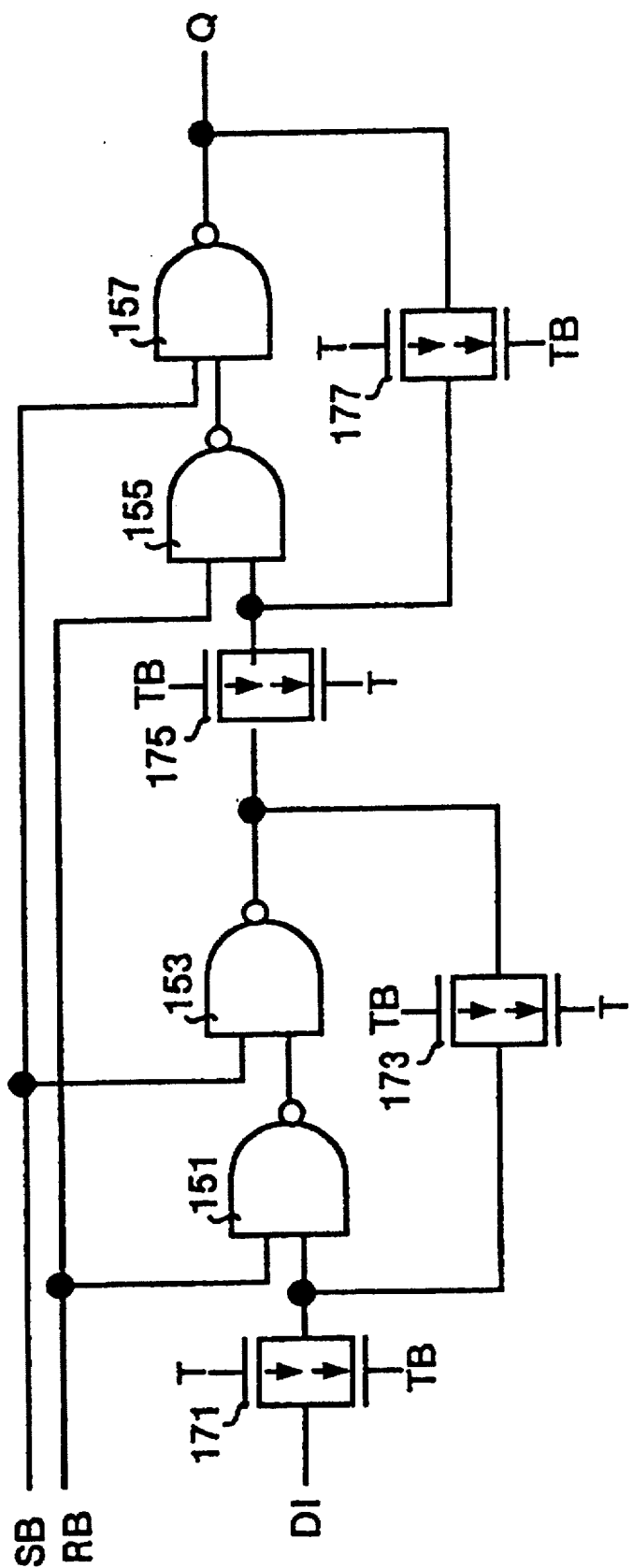
FIG. 5 is a circuit diagram of the F/F which is used in the semiconductor device according to the second embodiment of the invention.

Next, FIG. 5 is a circuit diagram of the F/F to be used in the semiconductor device according to a second embodiment. As shown in FIG. 5, the F/F has a transfer gate circuit 171, an NAND circuit 151 and an NAND circuit 153. The transfer gate circuit 171 has a clock terminal T into which a clock input signal TI is inputted and a terminal TB into which an inverted signal of the clock input signal TI is inputted, and the transfer gate circuit 171 is connected with the data input terminal DI. The NAND circuit 151 is connected with a reset burn-in terminal RB into which a reset burn-in signal RBI is inputted with an output terminal of the transfer gate circuit 171. The NAND circuit 153 is connected with a set burn-in terminal SB into which a set burn-in signal SBI is inputted and with an output terminal of the NAND circuit 151.

Further, the F/F is composed of a transfer gate circuit 173, a transfer gate circuit 175, an NAND circuit 155, an NAND circuit 157 and a transfer gate circuit 177. The transfer gate circuit 173 has a clock terminal T and a terminal TB into which an inverted signal of the clock signal is inputted, and the transfer gate circuit 173 is connected with the output terminal of the transfer gate circuit 171 and with an output terminal of the NAND circuit 153. The transfer gate circuit 175 has the clock terminal T and the terminal TB into which the inverted signal of the clock signal is inputted, and is connected with the output terminal of the NAND circuit 153. The NAND circuit 155 is connected with the reset burn-in terminal RB and with an output terminal of the transfer gate circuit 175. The NAND circuit 157 is connected with the set burn-in terminal SB and an output terminal of the NAND circuit 155. The transfer gate circuit 177 is connected with the output terminal of the transfer gate circuit 175 and an output terminal of the NAND circuit 157.

As for the operation of the F/F, in the case where "L" is applied to the clock terminal T and "H" is applied to the terminal TB into which the inverted signal is inputted, the transfer gate circuits 171 and 177 are in ON state, and the transfer gate circuits 173 and 175 are in OFF state. For this reason, when signals "1", "0", "1", "0" are applied to the reset burn-in terminal RB and signals "1", "1", "0", "0" are applied to the set burn-in terminal SB, outputs Q of the NAND circuit 157 become "0", "1", "1", "1".

In addition, in the case where "H" is applied to the clock terminal T and "L" is applied to the terminal TB into which the inverted signal is inputted, the transfer gate circuits 171 and 177 are in OFF state, and the transfer gate circuits 173 and 175 are in ON state. For this reason, when signals "1", "0", "1", "0" are applied to the reset burn-in terminal RB and signals "1", "1", "0", "0" are applied to the set burn-in terminal SB, outputs of the NAND circuit 153 become "0", "1", "1", "1".

At this time, outputs of the NAND circuit 155 become "1", "1", "0", "1", and outputs Q of the NAND circuit 153 become "0", "0", "1", "1".

Figure 6:
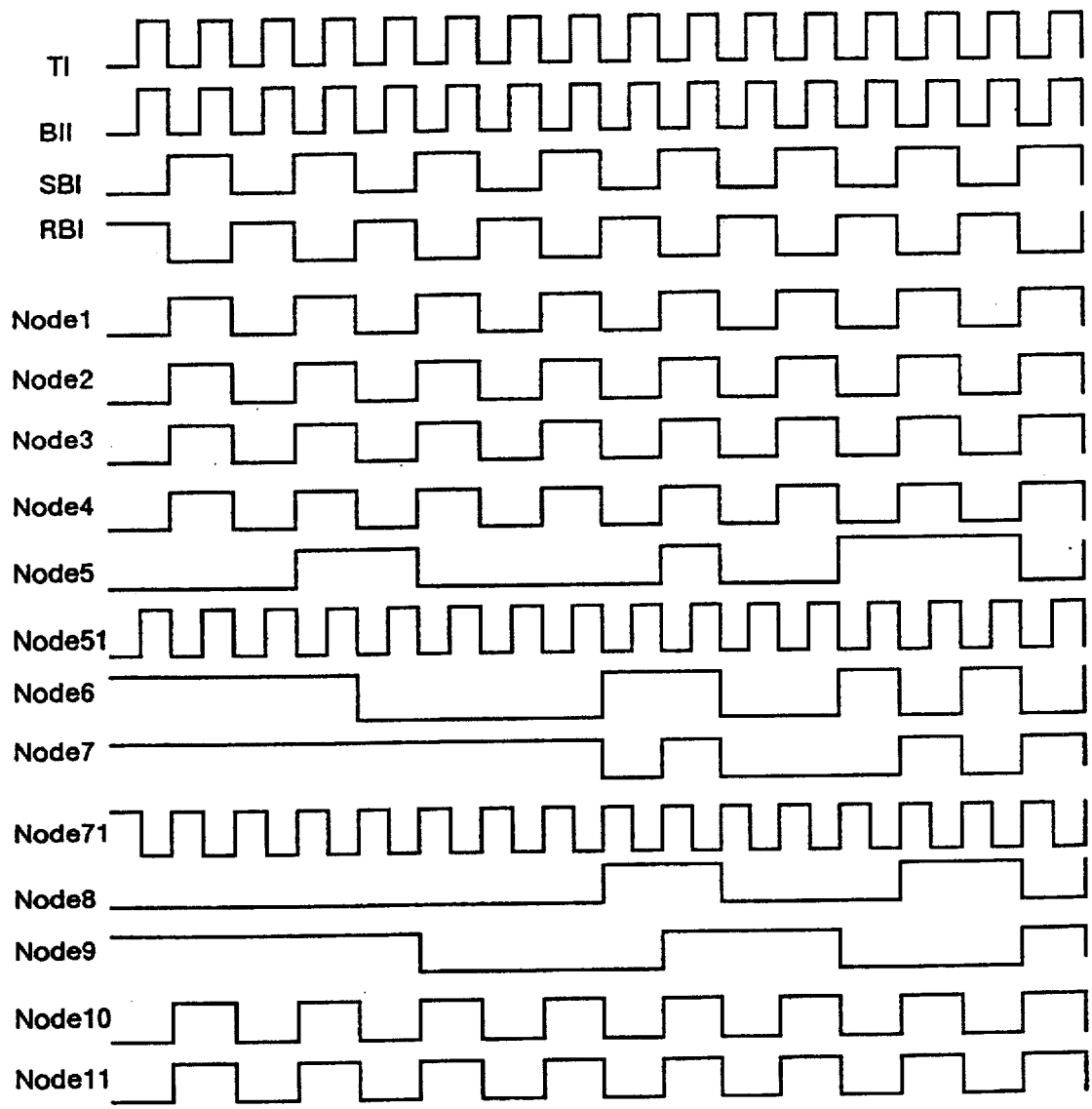
FIG. 6 is a timing chart of the semiconductor device according to the second embodiment of the invention.

Further, FIG. 6 is a timing chart of the semiconductor device according to the second embodiment of the invention. As shown in FIG. 6, a clock input signal TI, a set burn-in signal SBI and a reset burn-in signal RBI are inputted from the burn-in apparatus to corresponding terminals of the F/Fs 111 through 116 of the semiconductor device 1. Moreover, a burn-in input signal BII is inputted into the XOR circuits 121 and 122 of the semiconductor device 1.

For example, even if a delay waveform shown in FIG. 6 is generated at the node 5 connected with the logic block 131, since the node 51 is connected with the XOR circuit 121, a signal waveform similar to that of the burn-in input signal BII is generated at the node 51 due to the burn-in input signal BII. Due to the signal of the node 51, the logic block 134 generates an inverted signal waveform like a waveform of the node 9.

Further, the signal waveforms of the node 2 and the node 6 are compared with each other so that an operating state of the logic block 132 can be found.

Further, the signal waveforms of the nodes 3, 4 and 7 are compared with each other, so that an operating state of the logic block 133 can be found. Even if a defect occurs in one of the logic blocks connected with the XOR circuit, a logic block to be connected next can be activated by the XOR circuit. As a result, the burn-in test can be continued without stopping the outputs Q of the F/Fs.

According to the second embodiment, similarly to the first embodiment, even if it is difficult to activate one logic block, the burn-in test can be continued without stopping the outputs Q of the F/Fs thereinafter.

Further, according to the second embodiment, it is easy to specify a logic block where a defect occurs.

Further, according to the second embodiment, since a voltage stress can be given to all the nodes of the logic blocks, the burn-in test can be conducted efficiently.

Figure 7:
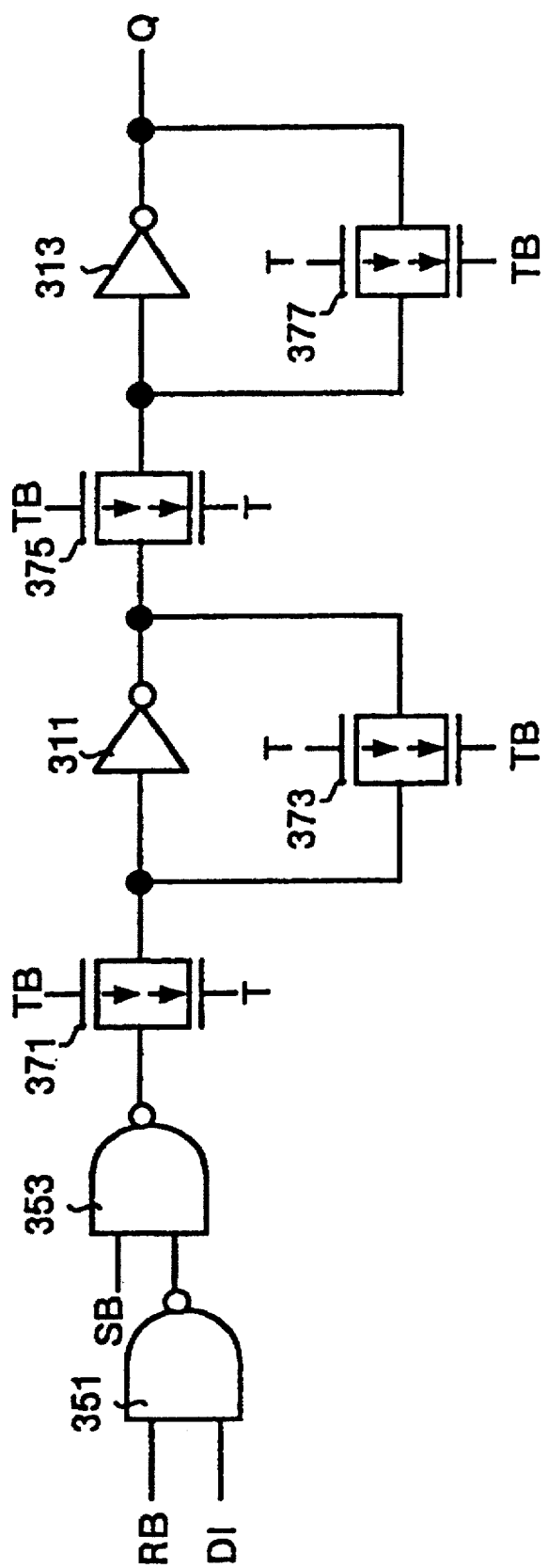
FIG. 7 is a circuit diagram of the F/F which is used in the semiconductor device according to a third embodiment of the invention.
Figure 8:
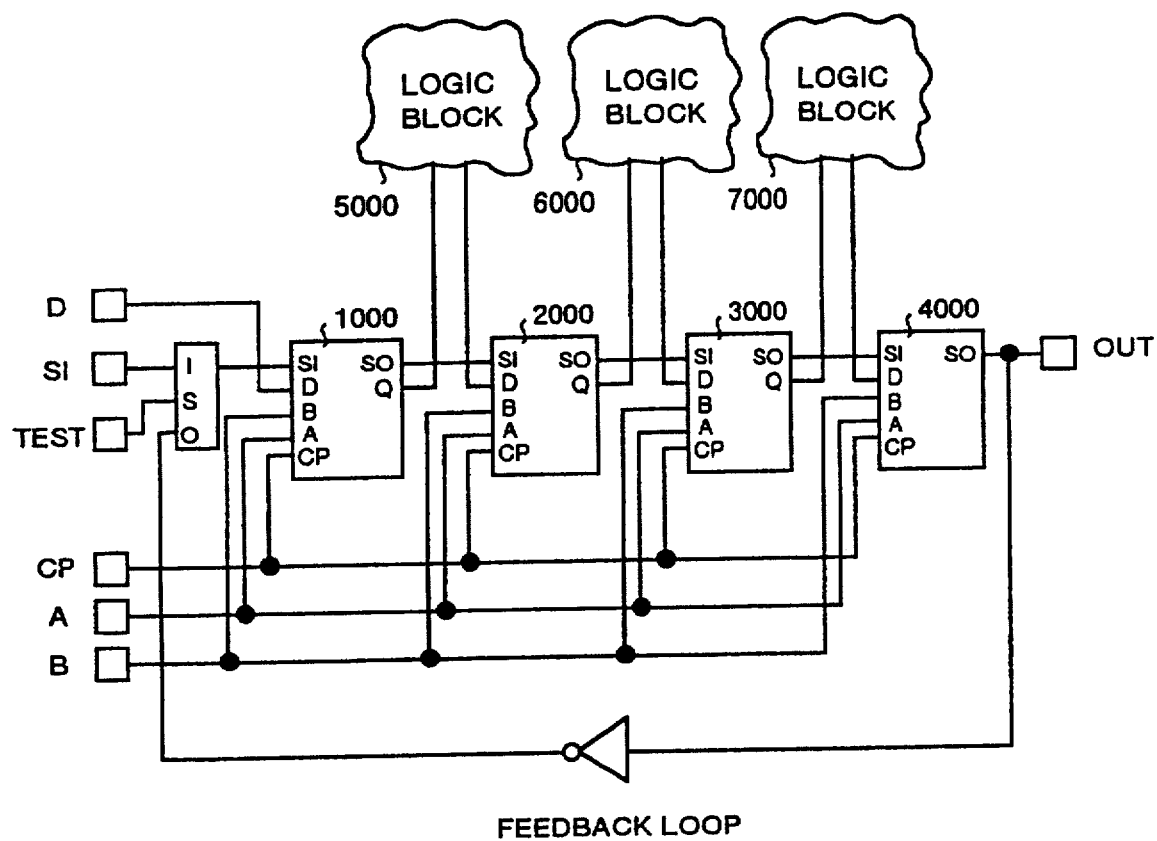
FIG. 8 is a diagram showing a structure of a conventional semiconductor device for conducting a burn-in test.

FIG. 7 is a circuit diagram of the F/F of the semiconductor device according to a third embodiment of the invention. As shown in FIG. 7, the F/F has an NAND circuit 351, an NAND circuit 353 and a transfer gate circuit 371. The NAND circuit 351 is connected with the reset burn-in terminal RB into which a reset-burn-in signal RBI is inputted and with the data input terminal DI. The NAND circuit 353 is connected with the set burn-in terminal SB into which a set burn-in signal SBI is inputted and with an output terminal of the NAND circuit 351. The transfer gate circuit 371 has a clock terminal T into which a clock input signal TI is inputted and a terminal TB into which an inverted signal of the clock input signal TI is inputted, and is connected with an output terminal of the NAND circuit 353.

Further, the F/F is composed of an inverter circuit 311, a transfer gate circuit 373, a transfer gate circuit 375, an inverter circuit 313 and a transfer gate circuit 377. The inverter circuit 311 is connected with an output terminal of the transfer gate circuit 371. The transfer gate circuit 373 has a clock terminal T and an terminal TB into which the inverted signal is inputted, and is connected with the output terminal of the transfer gate circuit 371 and with an output terminal of the inverter circuit 311. The transfer gate circuit 375 has the clock terminal T and the terminal TB into which the inverted signal is inputted, and is connected with the output terminal of the inverter circuit 311. The inverter circuit 313 is connected with an output terminal of the transfer gate circuit 375. The transfer gate circuit 377 has the clock terminal T and the terminal TB into which the inverted signal is inputted, and is connected with the output terminal of the transfer gate circuit 375 and with an output terminal of the inverter circuit 313.

As for the operation of the F/F, in the case where "H" is applied to the clock terminal T and "L" is applied to the terminal TB into which an inverted signal is inputted, the transfer gate circuits 373 and 377 are in OFF state, and the transfer gate circuits 371 and 375 are in ON state. For this reason, when signals "1", "0", "1", "0" are applied to the reset burn-in terminal RB and "H" data are applied to the data input terminal DI, outputs of the NAND circuit 351 become "0", "1", "0", "1".

Further, when signals "1", "0", "1", "0" are applied to the set burn-in terminal SB, outputs of the NAND circuit 353 become "1", "0", "1", "1". Since the transfer gate circuits 371 and 375 are in the ON state, the outputs of the NAND circuit 353 become directly outputs Q of F/F due to the inverter circuits 311 and 313.

Further, when, in this state, "L" data are applied to the data input terminal DI, outputs of the NAND circuit 351 become "1", "1", "1", "1".

Further, when signals "1", "0", "1", "0" are applied to the set burn-in terminal SB, outputs of the NAND circuit 353 become "0", "0", "1", "1". Since the transfer gate circuits 371 and 375 are in the ON state, the outputs of the NAND circuit 353 become directly the outputs Q of the F/F due to the inverter circuits 311 and 313.

Further, in the case where "L" is applied to the clock terminal T and "H" is applied to the terminal TB into which the inverted signal is inputted, the transfer gate circuits 373 and 377 are in ON state, and the transfer gate circuits 371 and 375 are in OFF state. For this reason, outputs of the inverter circuits 311 and 313 are latched until the transfer gate circuits 371 and 375 are in ON state next.

According to the third embodiment of the invention, the F/F having the structure simpler than that in the second embodiment shows the same effect.

The above-mentioned first to third embodiments described the case using the XOR circuit, but a XNOR circuit may be used (not shown). However, in this case, a polarity with respect to the burn-in input signal BII is changed. That is, an output signal of the XNOR circuit has a polarity which is opposite to that of the XOR circuit.

Further, the effect of the fourth embodiment of the invention is completely the same as those of the first to third embodiments.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a test circuit including a plurality of logic blocks to be tested in a burn-in test;
   a flip-flop circuit, a first logic block of said plurality of logic blocks being connected to an output of said flip-flop circuit for burn-in testing of said first logic block; and
   an exclusive-OR circuit having a first input terminal connected to an output of said first logic block, a second input terminal receiving a burn-in input signal, and an output terminal connected to a second logic block of said plurality of logic blocks for burn-in testing of said second logic block, whereby said second logic block may be burn-in tested even if said first logic block fails.

2. The semiconductor device according to claim 1, wherein said flip-flop circuit includes:
   a first logic circuit having a data input terminal and a selector burn-in terminal into which a selector burn-in signal is input;
   an inverter circuit connected to said selector burn-in terminal;
   a second logic circuit having a serial input terminal and a terminal into which a signal inverted by said inverter circuit is input;
   a third logic circuit connected to output terminals of said first logic circuit and said second logic circuit; and
   a flip-flop having a clock terminal into which a clock input signal is input and a data input terminal connected to an output terminal of said third logic circuit.

3. The semiconductor device according to claim 1, wherein said flip-flop circuit includes:
   a first transfer gate circuit having a clock terminal into which a clock input signal is input and a terminal into which an inverted signal of the clock input signal is input, said first transfer gate circuit being connected to a data input terminal;
   a first logic circuit connected to a reset burn-in terminal into which a reset burn-in signal is input and to an output terminal of said first transfer gate circuit;
   a second logic circuit connected to a set burn-in terminal into which a set burn-in signal is input and to an output terminal of said first logic circuit;
   a second transfer gate circuit having a clock terminal into which a clock input signal is input and a terminal into which an inverted signal of the clock input signal is input, said second transfer gate circuit being connected to said output terminal of said first transfer gate circuit and to an output terminal of said second logic circuit;
   a third transfer gate circuit having a clock terminal into which a clock input signal is input, and a terminal into which an inverted signal of the clock input signal is input, said third transfer gate circuit being connected to said output terminal of the second logic circuit;
   a third logic circuit connected to said reset burn-in terminal and to an output terminal of said third transfer gate circuit;
   a fourth logic circuit connected to said set burn-in terminal and to an output terminal of said third logic circuit; and
   a fourth transfer gate circuit connected to an output terminal of said third transfer gate circuit and to an output terminal of said fourth logic circuit.

4. The semiconductor device according to claim 1, wherein said flip-flop circuit includes:
   a first logic circuit connected to a reset burn-in terminal into which a reset burn-in signal is input and to a data input terminal;
   a second logic circuit connected to a set burn-in terminal into which a set burn-in signal is input and to an output terminal of said first logic circuit;
   a first transfer gate circuit having a clock terminal into which a clock input signal is input and a terminal into which an inverted signal of the clock input signal is input, said first transfer gate circuit being connected to an output terminal of said second logic circuit;
   a first inverter circuit connected to an output terminal of said first transfer gate circuit;
   a second transfer gate circuit having a clock terminal into which a clock input signal is input and a terminal into which an inverted signal of the clock input signal is input, said second transfer gate circuit being connected to an output terminal of said first transfer gate circuit and to an output terminal of said first inverter circuit;

a third transfer gate circuit having a clock terminal into which a clock input signal is input and a terminal into which an inverted signal of the clock input signal is input, said third transfer gate circuit being connected to an output terminal of said first inverter circuit;

a second inverter circuit connected with an output terminal of said third transfer gate circuit; and a fourth transfer gate circuit having a clock terminal into which a clock input signal is input and a terminal into which an inverted signal of the clock input signal is input, said fourth transfer gate circuit being connected to an output terminal of said third transfer gate circuit and to an output terminal of said second inverter circuit.

* * * * *